United States Patent
Katti

(10) Patent No.: US 7,027,321 B2
(45) Date of Patent: Apr. 11, 2006

(54) TUNNELING ANISOTROPIC MAGNETORESISTIVE DEVICE AND METHOD OF OPERATION

(75) Inventor: Romney R. Katti, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 14 days.

(21) Appl. No.: 10/754,882

(22) Filed: Jan. 10, 2004

(65) Prior Publication Data

US 2005/0152181 A1 Jul. 14, 2005

(51) Int. Cl.
*G11C 11/00* (2006.01)

(52) U.S. Cl. ........................ 365/158; 365/173

(58) Field of Classification Search ................ 365/158, 365/171, 172, 173
See application file for complete search history.

(56) References Cited

U.S. PATENT DOCUMENTS

| | | | | |
|---|---|---|---|---|
| 5,756,366 | A | 5/1998 | Berg et al. .................. 437/48 |
| 5,852,531 | A | 12/1998 | Yamada ....................... 360/113 |
| 5,965,283 | A | 10/1999 | Solin et al. .................. 428/692 |
| 5,966,008 | A | 10/1999 | Maier et al. ................... 324/96 |
| 5,982,658 | A * | 11/1999 | Berg et al. .................. 365/158 |
| 6,111,784 | A * | 8/2000 | Nishimura ................... 365/173 |
| 6,172,902 | B1 | 1/2001 | Wegrowe et al. ........... 365/158 |
| 6,455,177 | B1 | 9/2002 | Everitt et al. |
| 6,522,573 | B1 | 2/2003 | Saito et al. .................. 365/158 |
| 6,577,526 | B1 | 6/2003 | Schwarzl ..................... 365/158 |
| 6,581,480 | B1 | 6/2003 | May et al. ............. 73/862.233 |
| 6,633,498 | B1 | 10/2003 | Engel et al. ................. 365/158 |
| 6,730,949 | B1 * | 5/2004 | Kishi et al. .................. 257/295 |
| 6,906,947 | B1 | 6/2005 | Bloomquist et al. ........ 365/158 |
| 6,912,152 | B1 | 6/2005 | Iwata et al. .................. 365/158 |
| 2004/0032765 | A1 | 2/2004 | Deak |
| 2004/0228171 | A1 * | 11/2004 | Ho et al. ..................... 365/158 |

FOREIGN PATENT DOCUMENTS

| EP | 0 910 092 A2 | 4/1999 |
|---|---|---|
| EP | 0 959 475 A2 | 11/1999 |

OTHER PUBLICATIONS

Slaughter, "Magnetic Tunnel Junction Materials for Electronic Applications," JOM (Jun. 2000). (www.tms.org/pubs/journals/JOM/0006/Slaughter/Slaughter-0006.html).
Daughton, "Magnetoresistive Random Access Memory (MRAM)," pp1-13 (Feb. 4, 2000).
International Search Report.

* cited by examiner

*Primary Examiner*—Gene N. Auduong
(74) *Attorney, Agent, or Firm*—McDonnell Boehnen Hulbert & Berghoff LLP

(57) ABSTRACT

The present invention provides for a tunneling anisotropic magnetoresistive (TAM) device and a method of operation. An embodiment of the device provides for a magnetic conducting sense layer with a fixed edge spin and a center magnetization direction, a magnetic conducting storage layer with a fixed edge spin and a center magnetization direction, and a nonmagnetic nonconducting barrier layer sandwiched between the sense layer and the storage layer. In one embodiment, the two center magnetization directions are aligned with a hard axis of the device, and the center magnetization direction of the storage layer is indicative of a logical state of the device. A larger magnetic field is required to invert the center magnetization direction of the storage layer than is required to invert the center magnetization direction of the sense layer.

25 Claims, 7 Drawing Sheets

TUNNELING ANISOTROPIC MAGNETORESISTIVE DEVICE AND METHOD OF OPERATION

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetic memory and more specifically to tunneling magnetoresistive devices.

2. Background

Many advances in memory technology have been made in recent years. One such advance is the magnetic tunnel junction (MTJ) that makes use of the tunneling magnetoresistive effect to store binary information. MTJs are favored because they provide high data read speeds, are nonvolatile, and have a high magnetoresistive ratio. The basic structure of the MTJ is shown in FIG. 1 as a tri-layer device having a barrier layer 16 sandwiched between magnetic (ferromagnetic) layers 12 and 14. Each magnetic layer has an associated magnetization direction.

In a typical arrangement, one of the magnetic layers is configured to be a fixed layer 14. A single headed arrow in layer 14 indicates that layer 14 is a fixed layer with a fixed magnetic direction along an easy axis (long axis) of the MTJ. An anti-ferromagnetic layer (not shown) may be useful in fixing the magnetization direction of the fixed layer. Thus, the fixed layer is treated substantially like a permanent magnet with a permanent direction. A second magnetic layer is termed a free layer 12. The free layer 12 is configured to switch the direction of its magnetization in response to a sufficient externally applied magnetic field. The double headed arrow at free layer 12 indicates that the magnetization direction of the free layer 12 may be inverted by an applied magnetic field.

In order to store binary data, the MTJ must have two possible logical states (i.e. binary states). These states are often referred to as "1" and "0." The state of the MTJ is defined by whether the magnetization directions of the two magnetic layers 12 and 14 are parallel or anti-parallel. If the magnetization directions the two magnetic layers 12 and 14 are the same then they are said to be parallel. Alternatively, if the magnetization directions of the two magnetic layers are opposite, they are said to be anti-parallel.

The tunneling magnetoresistive effect is based on the phenomena that an applied magnetic field can influence the resistivity of a material. In simple terms, the resistance to a current passing through the MTJ is "high" when the magnetization directions of the magnetic layers are anti-parallel and "low" when the magnetization directions are parallel. Usually, the resistivity of an MTJ is determined by measuring a read current passed perpendicularly through each layer of the MTJ. A read current (i) is shown passing perpendicularly through the layers of FIG. 1. Because of the direction of read current flow, an MTJ is termed a current perpendicular to plane (CPP) device.

One measure for the quality of an MTJ is its magnetoresistive ratio defined as $(\Delta R/R_{min})$. $\Delta R$ is defined as the difference between (1) the resistivity of the MTJ when the magnetization directions are anti-parallel and (2) the resistivity of the MTJ when the magnetization directions are parallel, while $R_{min}$ is the resistivity of the MTJ when the magnetization directions are anti-parallel (minimum resistivity).

In general, a current flowing through a wire produces a magnetic field. The direction of the magnetic field is perpendicular to the direction of current flow and follows the "right hand rule." When writing to the MTJ, the magnetization direction of the free layer 12 is switched by applying a magnetic field to the MTJ. Usually, a pair of conducting lines running perpendicularly to one another are used to apply the external magnetic field to the MTJ by passing currents through each line. These lines may be termed a bit line and a digit line. The bit line may also be used to apply the read current (i).

The pseudo spin valve (PSV) is a second memory technology that uses the magnetoresistive effect to store data in a nonvolatile form. Unlike the MTJ, the PSV involves a conducting nonmagnetic layer sandwiched between two magnetic (ferromagnetic) layers. The basic structure of the PSV is shown in FIG. 2 as a tri-layer device having a conducting spacer layer 26 separating a magnetic sense layer 22 from a magnetic storage layer 24. Each of the two magnetic layers has an associated magnetization direction along an easy axis of the PSV. The logical state of the PSV is determined by the magnetization direction of the reference layer.

In the PSV, the sense layer 22 is configured to switch its magnetization direction in response to the application of a magnetic field of at least a first threshold. Likewise, the storage layer 24 will switch its magnetization direction in response to the application of a magnetic field of at least a second threshold. The second threshold is generally higher than the first threshold—thus the magnetization direction of the sense layer 22 is easier to switch than the magnetization direction of the storage layer 24. Because the storage layer 24 has a higher switching threshold than the sense layer 22, the storage layer 24 is said to have a higher coercivity than sense layer 22. The storage layer 24 is shown in FIG. 2 as thicker than the sense layer 22 as an indication of higher coercivity. A double headed arrow at both sense layer 22 and storage layer 24 indicate that the respective magnetization directions of the layers may be inverted by an applied magnetic field.

The logical state of the PSV is determined by the magnetization direction of the storage layer 24. Thus, during a write sequence, a magnetic field of at least the second threshold must be applied to the PSV in order to switch its logical state. During a read sequence, a read current (i) is passed across the PSV. Because the read current (i) flows parallel to the layers, a PSV is known as a current-in-plane (CIP) device.

Another magnetoresistive device is known as an anisotropic magnetoresistive (AMR) device. U.S. Pat. No. 5,756,366 provides some background on AMR devices and is hereby incorporated by reference. FIG. 3 provides a top view of a magnetization layer in an AMR device 30 with arrows indicating magnetization directions within the device. In FIG. 3, a central portion 32 of the AMR device has a center magnetization direction pointing upward and parallel to a hard axis (short axis) of the AMR device. Edge spin 34 is shown pointed primarily to the right along an easy axis of the AMR device. In operation, the center magnetization direction may be inverted by an applied magnetic field. Thus, in a similar representation (not shown), the center magnetization direction would be shown pointed downward. Unlike the center magnetization direction, the edge spin has a magnetization direction that is intended to be substantially fixed and to not invert its direction in response to an applied magnetic field. AMR devices, however, typically offer a low signal level.

SUMMARY OF THE INVENTION

The embodiments described below provide a tunneling anisotropic magnetoresistive device and a method for reading its logical state.

In a first aspect, a tunneling anisotropic magnetoresistive (TAM) element for storing data comprises a tri-layer device having a sense layer, a storage layer, and a barrier layer. The sense layer is a conducting, magnetic layer having a fixed edge spin and a center magnetization direction. Likewise, the storage layer is a conducting, magnetic layer having a fixed edge spin and a center magnetization direction. The barrier layer is a nonconducting, nonmagnetic layer sandwiched between the sense layer and the storage layer. The fixed edge spin of each layer may be configured to have a magnetization direction along an easy axis of the TAM element. In an embodiment, a process can be used to fix the magnetization direction of edges of the TAM element, such as making an alloy, forming an intermetallic, or providing a protective oxide layer.

In one embodiment, the center magnetization direction of each layer is along a hard axis of the TAM element. The magnetization direction of the center of the sense layer is designed to invert in response to a magnetic field of at least a first threshold strength being applied to the TAM element. The magnetization direction of the center of the storage layer is also designed to invert in response to a magnetic field of at least a second threshold strength being applied to the TAM element. In this embodiment, the magnetization direction of the center of the storage layer acts as a nonvolatile memory store. Thus, the magnetization direction of the center of the storage layer is indicative of a logical state of the TAM element. So that the storage layer will more reliably store data and for proper operation, the storage layer is designed with a higher coercivity than the sense layer. The differences in coercivities causes the second threshold strength to be greater than the first threshold strength. In other words, a smaller magnetic field is required to switch the center magnetization direction of the sense layer than is required to switch the center magnetization direction of the storage layer. Preferably, the center magnetization direction of each element is substantially unbiased in its inversion. For example, the center magnetization direction of the sense layer is configured to switch from a second direction to a first direction in response to a magnetic field applied with a first threshold strength, and is configured to switch from a first direction to a second direction in response to a magnetic field applied with the same (first threshold) strength and opposite direction.

A second aspect provides a method of determining a logical state of a tunneling TAM element. The TAM element may, for example, be a tri-layer element having a barrier layer sandwiched between a sense layer and a storage layer. The logical state of the TAM element is determinable from a center magnetization direction of the storage layer. Thus, a purpose of the method may be to obtain a metric that is indicative of the center magnetization direction of the storage layer.

Because resistivity across the TAM element changes according to the relative center magnetization directions of the sense and storage layers, a combined knowledge of the center magnetization direction of the sense layer and resistivity across the TAM element is indicative of the center magnetization direction of the storage layer. Thus, the method provides for ensuring that the center magnetization direction of the sense layer is in a first direction, applying a voltage across the barrier layer, and obtaining the metric indicative of the center magnetization direction of the storage layer.

In order to ensure that the center magnetization direction of the sense layer is in the first direction, a magnetic field may be applied to the TAM element. The strength of the magnetic field should be configured so that the center magnetization direction of the storage layer is held constant during the application of the magnetic field. This configuration may be aided by designing the storage layer with a higher coercivity than the sense layer.

Additionally, bit edges of the sense and storage layer may be configured with a fixed edge spin such that the magnetization direction of the bit edges are parallel to an easy axis of the TAM element. The magnetic field may be created by currents passing through one or more conducting lines that are arranged near the TAM element. Control circuitry may also be provided for passing the currents through the conducting lines.

The metric indicative of the center magnetization direction of the storage layer may be obtained with a sensor such as an ammeter or voltmeter, for example. Likewise, the metric may be obtained by calculating whether the resistivity of the TAM element is above a threshold. When the resistivity is below the threshold, the center magnetization directions of the two layers are parallel, and thus, the center magnetization direction of the storage layer is in the first direction. Conversely, when the resistivity is below the threshold, the center magnetization directions of the two layers are anti-parallel, and thus, the center magnetization direction of the storage layer is in the second direction.

A third aspect provides a magnetoresistive cell having a tunneling anisotropic element and a pair of conducting lines arranged near the anisotropic element. The anisotropic element has a pair of magnetic layers sandwiching a nonmagnetic barrier layer. Each magnetic layer has a pair of bit edges with fixed edge magnetizations aligned parallel to an easy axis of the element. Additionally, each magnetic layer has a magnetically soft center with a center magnetization direction. The magnetoresistive cell further comprises a word line for applying a first magnetic field to the element; and a digit line for applying a second magnetic field to the element and for delivering a read current to a first side of the element.

DETAILED DESCRIPTION

1. Overview

Figure 1:
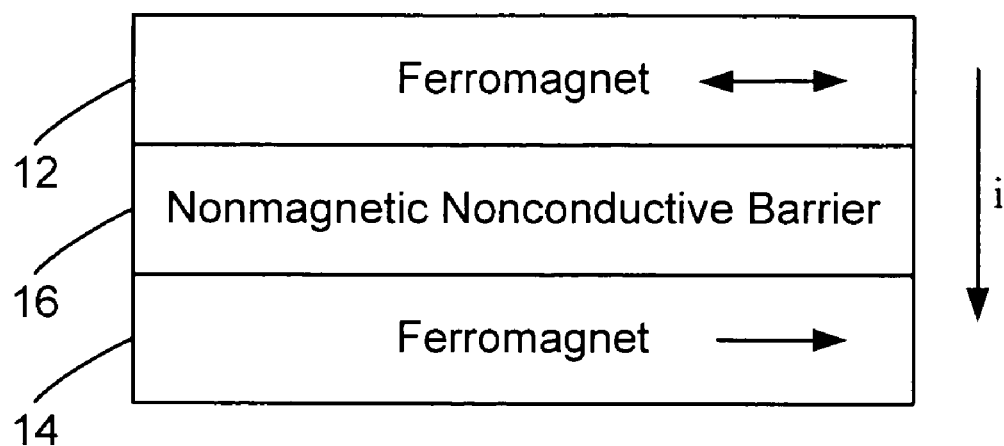
FIG. 1 is a schematic diagram of the layers of a prior art magnetic tunneling junction (MTJ) element.
Figure 2:
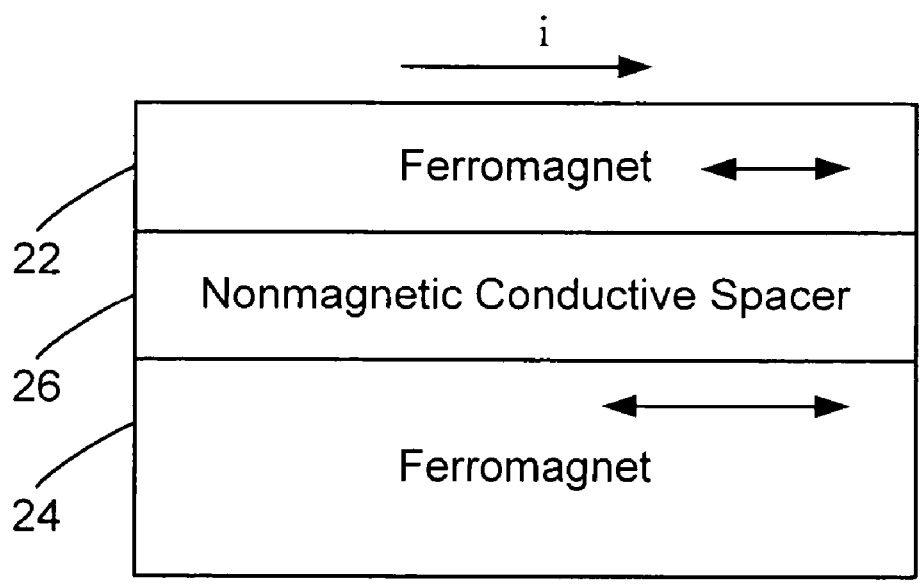
FIG. 2 is a schematic diagram of the layers of a prior art pseudo spin valve (PSV) element.
Figure 3:
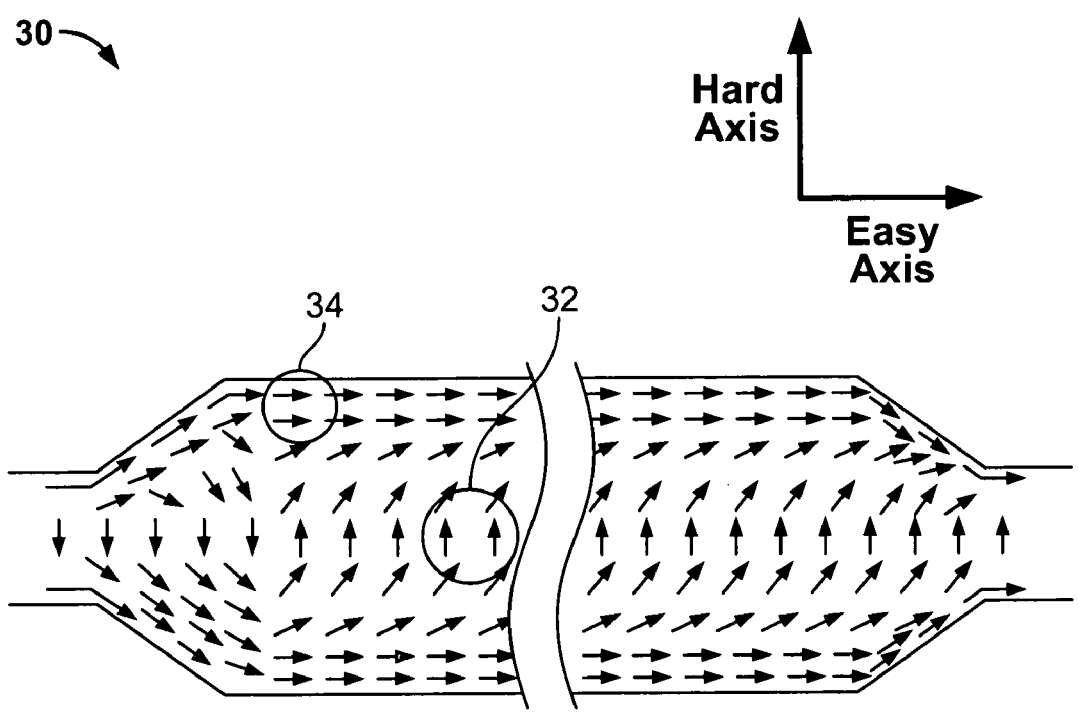
FIG. 3 is a top view of a magnetic layer of an anisotropic magnetoresistive (AMR) element.
Figure 4A:
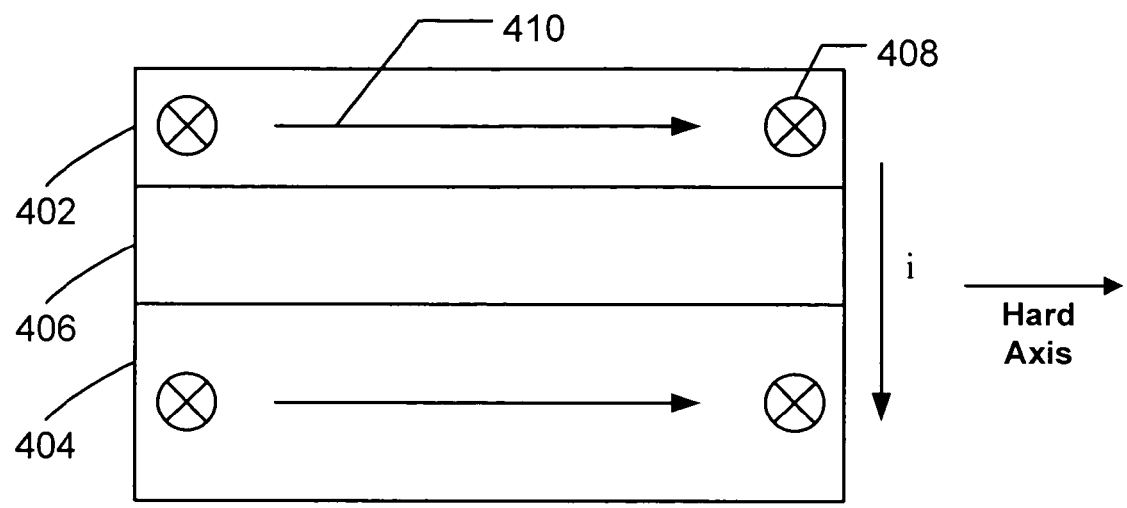
FIG. 4a is a schematic diagram of an embodiment of a tunneling anisotropic magnetoresistive (TAM) element.

Referring to the drawings, FIG. 4a is a schematic diagram of a tunneling anisotropic magnetoresistive (TAM) element. The TAM element is shown as a tri-layer device having a barrier layer 406 sandwiched between a sense layer 402 and a storage layer 404. A center magnetization direction 410 is shown pointing to the right (parallel to a hard axis) in both the sense layer 402 and the storage layer 404. An edge spin 408 is shown at each edge of both the sense layer 402 and the storage layer 404. A read current (i) is shown flowing perpendicularly across the layers of the TAM element.

The barrier layer 406 is preferably a thin film insulator. During a read sequence, a current is passed through the barrier layer 406. According to classical physics, this operation is not possible because the resistance across the barrier layer 406 should be infinity. However, at a nanometric scale, the tunneling current may flow in such a structure. The barrier layer may, for example, be manufactured by deposition on one of the ferromagnetic layer a 1–2 nm thick film of Al or Mg. The film is then oxidized to obtain an $Al_2O_3$ or MgO insulation layer. Various techniques of oxidation are applicable, for example plasma oxidation, thermal oxidation, oxygen glow discharge or direct deposition of $Al_2O_3$. Epitaxially grown barrier layers may also be incorporated in the present invention. For example, an MgO barrier layer may be elaborated by molecular beam epitaxy with a barrier layer thickness of approximately 0.8 nm. Care must be taken when producing the barrier layer to avoid pinholes and other impurities that could serve to electrically or magnetically couple the two ferromagnetic layers 402 and 404.

In an exemplary embodiment, the sense and storage layers 402 and 404 are ferromagnetic layers that bound two sides of the barrier layer 406, and are magnetically uncoupled from one another. The two ferromagnetic layers are designed with different coercivities. For example, the storage layer 404 is shown as thicker than the sense layer 402 to indicate a greater coercivity. Because a read sequence involves passing the read current (i) perpendicularly through the plane of each layer, each magnetic layer of the element must be an electrical conductor. As an example, the magnetic layers may be NeFe alloys or ferrous multilayers.

The center magnetization direction 410 is aligned in a direction substantially parallel to the hard axis of the element, and is configured to invert its direction in response to a magnetic field of sufficient strength applied to the element. An alternative view (not shown) of the center magnetization direction would display the center magnetization direction pointing to the left.

Figure 4B:
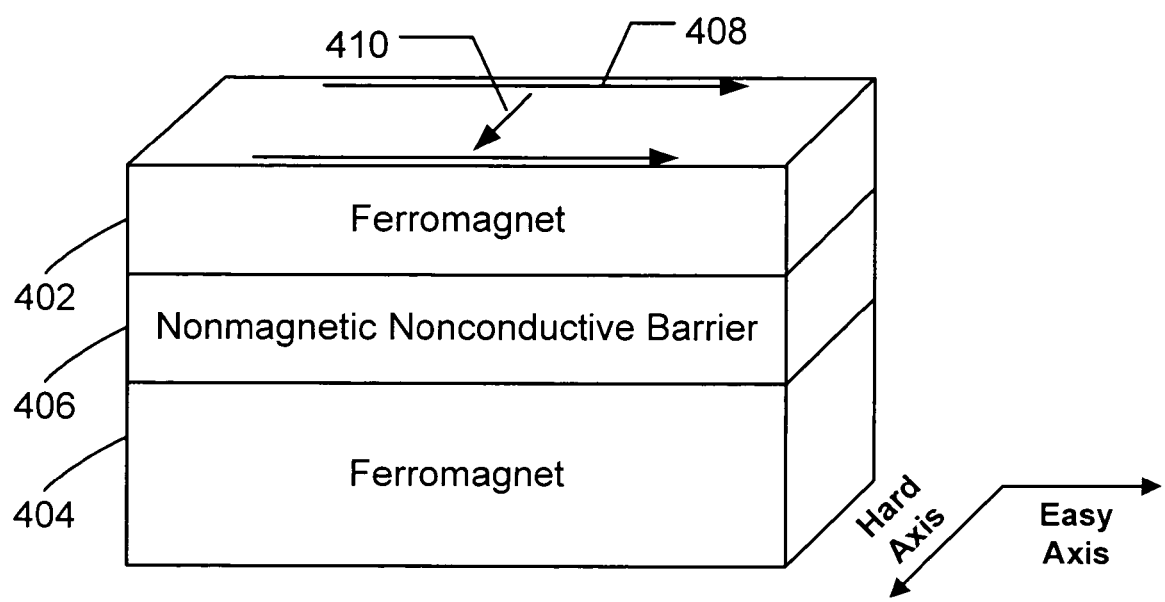
FIG. 4b is an isometric view of an embodiment of a TAM element.

FIG. 4b shows an isometric view of the TAM element of FIG. 4a. The edge spin 408 is shown along two bit edges of the sense layer 402. Likewise, an edge spin runs along two bit edges of the storage layer 404. The edge spin is configured to have a magnetization direction that is fixed along an easy axis of the TAM element.

2. Exemplary Architecture

Figure 5A:
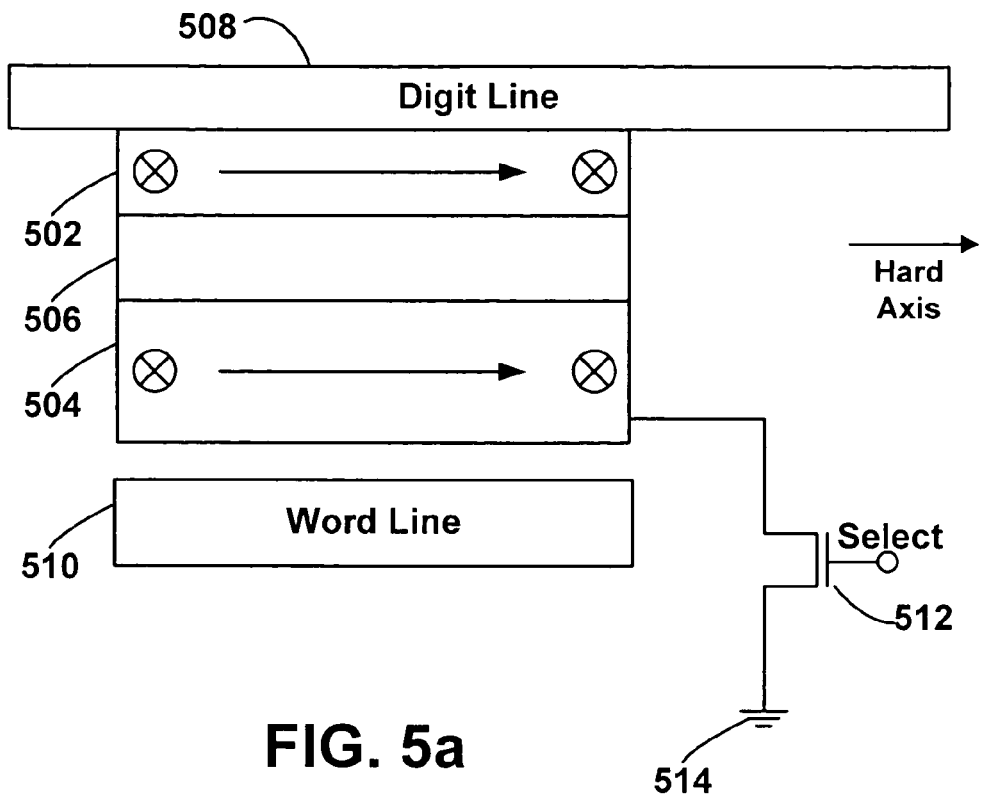
FIG. 5a is a schematic view of an embodiment of a tunneling magnetoresistive cell.

FIG. 5a shows a schematic diagram of an exemplary architecture of a cell in a memory device in accordance with the present invention. A nonmagnetic nonconductive barrier layer 506 is deposited between a conducting ferromagnetic sense layer 502 and a conducting ferromagnetic storage layer 504. Both the sense layer 502 and the storage layer 504 are free to invert their center magnetization directions in response to an applied magnetic field. However, inversion of the center magnetization direction of the storage layer 504 requires a larger magnetic field than does inversion of the center magnetization direction of the sense layer 502. A digit line 508 is electrically coupled to the sense layer 502, and is arranged near the two magnetic layers 502 and 504 such that a current passing through the digit line 508 creates a magnetic field that acts on the two magnetic layers 502 and 504. A word line 510 is also arranged near the two magnetic layers 502 and 504 such that a current passing through the word line 510 creates a magnetic field that acts on the two magnetic layers 502 and 504. A gate 512 interconnects the storage layer 504 and a ground 514. In another embodiment, the center magnetization direction of the storage layer 504 is fixed and serves as a reference. In that case, the orientation of the center magnetization direction of the sense layer 502 determines a logical state of the cell.

Figure 5B:
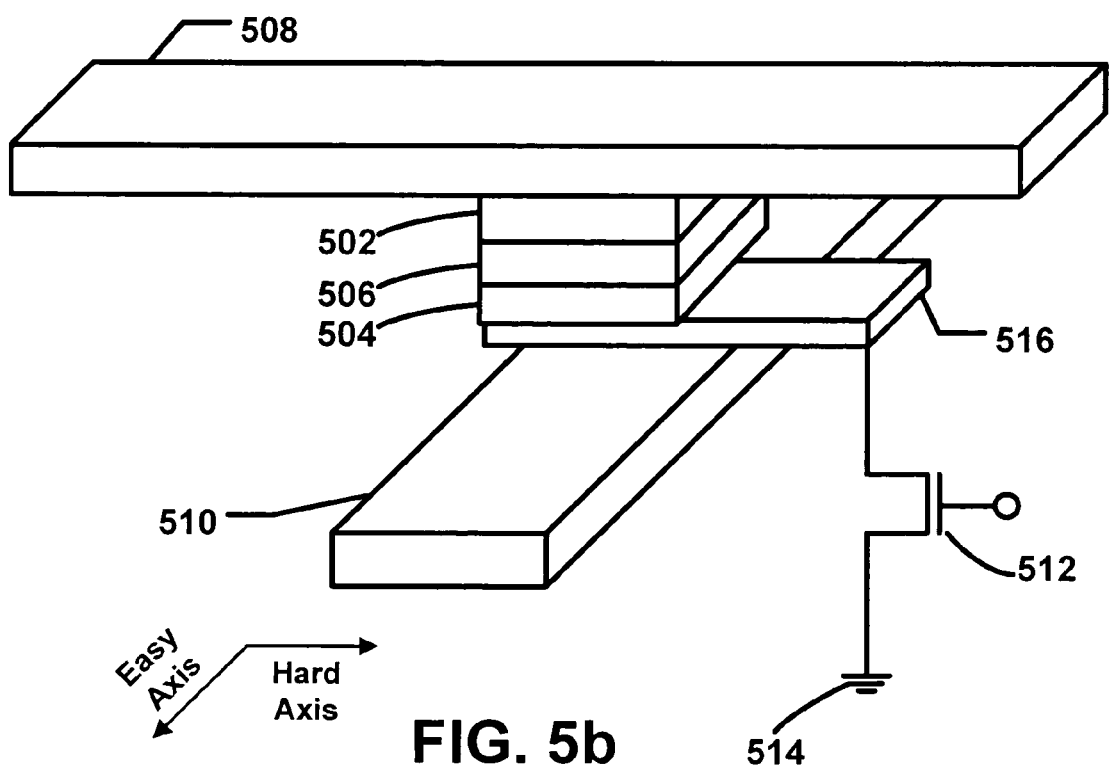
FIG. 5b is an isometric view of an embodiment of a tunneling magnetoresistive cell.

FIG. 5b shows an isometric view of the cell of FIG. 5a. In a preferred embodiment, the digit line 508 is aligned perpendicular to the word line 510. In one embodiment, the connection between the gate 512 and the storage layer 504 is accomplished through an additional read layer 516 attached to the storage layer 504 as shown in FIG. 5b. In another embodiment, the gate 512 is attached to a read line running to the edge of the storage layer 504 as shown in FIG. 5a. In an alternative embodiment, the digit line 508 is coupled to the storage layer 504 and the read transistor is coupled to the sense layer 502.

One use of the presently described embodiment is in a magnetic memory array. In the array, many tunneling magnetoresistive cells are arranged in a set of rows and columns. Each row of magnetoresistive cells may have a digit line that is coupled to each memory cell in the row. Similarly, each column may have a row line that is arranged near each magnetoresistive cell in the column such that a current in the digit line creates a magnetic field acting at least partially along an easy axis of the memory cells.

In an embodiment of the invention, a pair of current drivers may be configured to generate a first magnetic field with sufficient strength to invert the center magnetization direction of the sense layer 502 without inverting the center magnetization direction of the storage layer 504 during a read sequence. Likewise, the pair of current drivers may be further configured to generate a second magnetic field with sufficient strength to invert the magnetization direction of the storage layer 504 and the magnetization of the sense layer 502.

3. Exemplary Construction

Referring again to FIG. 5b, the steps of manufacturing of an embodiment of the tunneling magnetoresistive cell are described below. These steps are meant to be instructive rather than limiting. Beginning with a seed layer (not shown) such as Ta, a word line 510 is deposited. After an insulating layer is deposited on the word line 510, a read layer 516 is deposited for connecting the gate 512 with a storage layer 504. The storage layer 504 is deposited on the read layer 516, and a barrier 504 grown upon the storage layer 504. A sense layer 502 is deposited above the barrier layer 506. A digit line 508 is deposited on the sense layer 502 either directly or on an insulator (not shown) that interconnects the digit line 508 to the sense layer 502 through a via. The digit line 508 and word line 510 may be arranged to run in a matrix of rows and columns in which contacts are made to access transistors (not shown) for controlling current flow in the lines (508 and 510). A cap layer, such as of Ta, may also be provided as well as an etch stop such as CrSi or TiN.

A magnetic layer of the element may be designed as a single layer, a bilayer, or a multilayer. A single layer, for example, may be constructed of NiFe or NiFeCo. Alternatively, a bilayer, such as NiFe/CoFe may be used. More generally, a multilayer of various ferrous alloys may be used (a bilayer is a form of multilayer). The device may be grown by sputtering, ion beam deposition, plama vapor deposition, evaporation, or epitaxially, for example. Patterning can be by wet chemical etching, dry etching, ion milling, or reactive etching, for example.

Bit edges of the magnetic layers may be hardened to ensure a fixed edge spin. Hardening increases the coercivity of the bit edges. A magnetic hardening process may, for example provide for forming an oxide layer on each bit edge and then forming a protective layer on the oxide layer. Likewise, a process may be used to fix the magnetization direction of edges of the element, such as making an alloy, forming an intermetallic, or altering the shape of the element.

4. Logical States of the Elements

Figure 6:
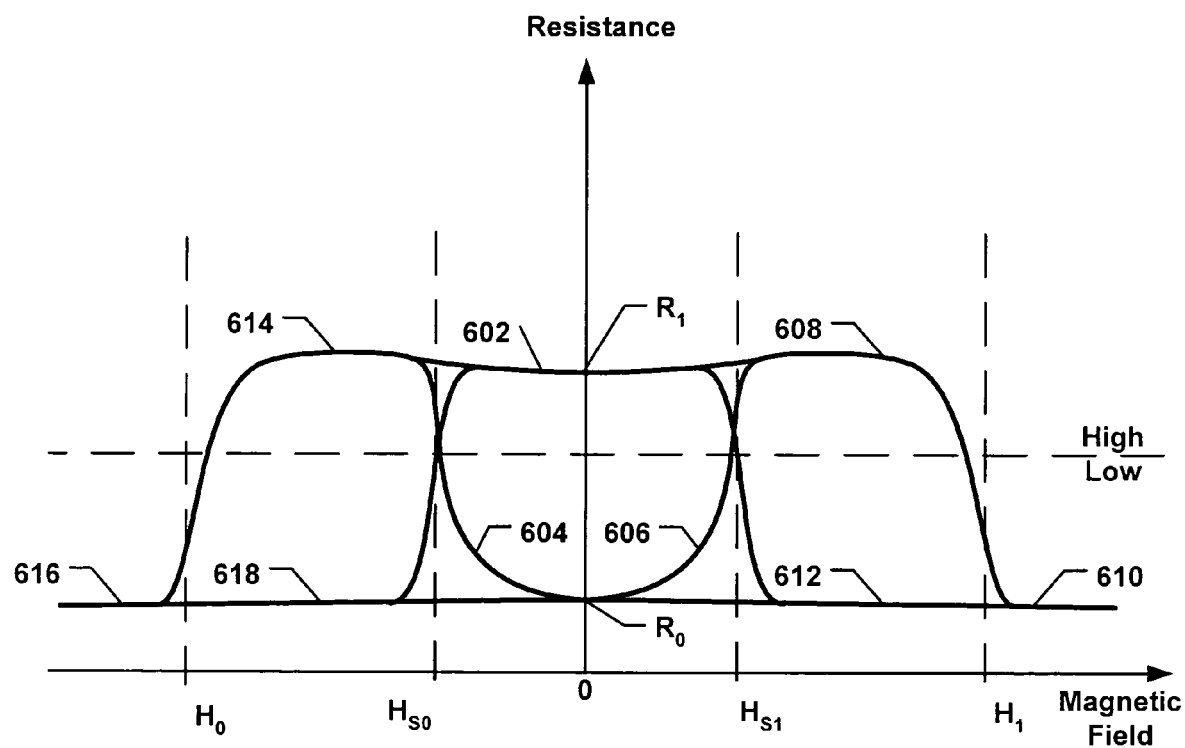
FIG. 6 is a hysteresis curve of an embodiment of a TAM element.
Figure 6:
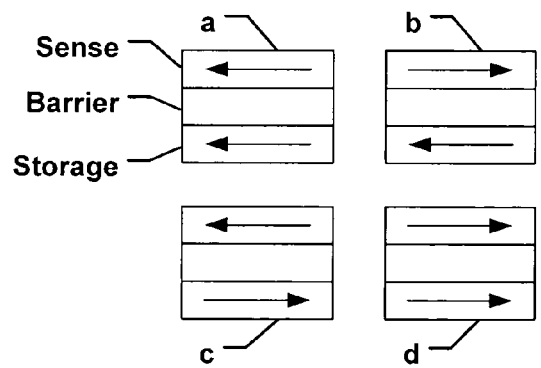

FIG. 6 is a graph of a hysteresis curve of an embodiment of a tunneling magnetoresistive element such as that shown in FIG. 4*a*. The horizontal axis represents the magnitude and direction of a magnetic field applied to the easy axis of the magnetoresistive element. Values along the positive horizontal axis represent a magnetic field in a first direction along the hard axis of the magnetoresistive element while values along the negative side of the horizontal axis represent a magnetic field in the opposite direction (still also along the hard axis). The origin of the horizontal axis represents zero applied magnetic field (also known as zero-field), this is demonstrated by a zero (0) label. Properties of the magnetoresistive element that exist at zero-field are thought of as stable or nonvolatile because no field is required to maintain their value.

The vertical axis represents the resistance exhibited by the magnetoresistive element. The resistance, for example, may be measured as the resistance associated with passing a current perpendicularly across a barrier layer of the magnetoresistive element. In one embodiment, the magnetic field shown by the horizontal axis is a composite magnetic field created by two currents passing through lines arranged near the magnetoresistive element.

As a simplification, resistance across the magnetoresistive element may reported as either "high" or "low"—thus producing a binary system. A threshold resistance is shown running horizontally along the graph to represent the dividing line in the binary system. Resistances above the threshold are considered "high." Resistances below the threshold are considered "low."

Because the magnetoresistive element has two possible center magnetization directions for each of the two uncoupled magnetic layers, there are four possible magnetization states of the element. The four possible magnetization states are shown below the graph in elements (a), (b), (c), and (d). In each of the elements (a)–(d), the top layer represents a sense layer, the middle layer represents a barrier layer and the bottom layer represents a storage layer. Single headed arrows in both the sense layer and storage layer represent the center magnetization directions of the layer along the hard axis of the element. For example, in element (a), both the sense layer and the storage layer have center magnetization directions pointing towards the left. Conversely, in element (b), the sense layer has a center magnetization direction pointing to the right while the storage layer has a center magnetization direction pointing to the left. For clarity, a center magnetization direction pointing to the right represents a first magnetization direction, and a center magnetization direction pointing to the left represents a second magnetization direction.

Looking again along the magnetic field axis (horizontal axis) of FIG. 6, $H_{s1}$ represents the application of a magnetic field that is just strong enough to switch the center magnetization direction of the sense layer to the first magnetization direction. Obviously, if the center magnetization direction of the sense layer is already in the first direction, then application of the $H_{s1}$ magnetic field will not cause a an additional switch. Looking further in the first direction, $H_1$ represents the application of a magnetic field that is just strong enough to switch the center magnetization direction of the storage layer to the first magnetization direction. $H_{s0}$ represents the application of a magnetic field that is just strong enough to switch the center magnetization direction of the sense layer to the second magnetization direction. Likewise, $H_0$ represents the application of a magnetic field that is just strong enough to switch the center magnetization direction of the storage layer to the second magnetization direction. In a preferred embodiment, $H_1$ and $H_0$ are of equal magnitude but opposite directions. Similarly, in a preferred embodiment, $H_{S1}$, is of equal magnitude but opposite direction of $H_{S0}$. In practice, a magnetic field should be applied that is greater than the thresholds mentioned to ensure a higher probability of proper switching.

As can be seen from the graph, there are two possible zero-field resistance measures ($R_1$ and $R_0$). $R_1$ represents a higher resistance across the barrier layer than does $R_0$. As mentioned, the resistance of the tunneling element is "high" when the center magnetization directions of the two magnetic layers are anti-parallel and "low" when the center magnetization directions are parallel. Thus, the "high" zero-field resistance of $R_1$ is created by opposing (anti-parallel) center magnetization directions as seen in elements (b) and (c). The "low" zero-field resistance of $R_0$ is created by parallel center magnetization directions as seen in elements (a) and (d).

When a magnetic field of strength greater than $H_{S1}$ (i.e. having a greater magnitude) is applied to the element, the center magnetization direction of the sense layer switches to a first magnetization direction. Thus, at point 608, the center magnetization directions are anti-parallel as in element b. Likewise at point 612, the center magnetization directions are parallel as in element (d). When a magnetization field of strength greater than $H_1$ is applied to the element, the center magnetization direction of both the sense layer and the storage layer are switched to a first magnetization direction as shown in element (d).

When a magnetic field of strength greater than $H_{S0}$ is applied to the element, the center magnetization direction of the sense layer switches to a second magnetization direction. Thus, at point 614, the center magnetization directions are anti-parallel as in element (c). Likewise at point 618, the center magnetization directions are parallel as in element (d). When a magnetization field of strength greater than $H_0$ is applied to the element, the center magnetization direction of both the sense layer and the storage layer are switched to a second magnetization direction as shown in element (a).

The center magnetization direction of the storage layer is indicative of the logical state of the element. Thus, when the center magnetization direction of the storage layer is in a first direction, as in elements (c) and (d), the element is in a first logical state. Likewise, when the center magnetization direction of the storage layer is in a second direction, as in elements (a) and (b), the element is in a second logical state.

In one embodiment, the magnetization hysteresis loop of the magnetoresistive element is substantially unbiased. Such an unbiased hysteresis loop is shown by FIG. 6. Additionally, the hysteresis loops of the individual layers (sense and storage) should be substantially unbiased.

FIG. 6 is meant to show an example of a hysteresis loop. Although the overall structure may be consistent across various embodiments, the specific path of the arcs and lines of FIG. 6 should not be seen as limiting and will depend upon various design parameters.

5. Exemplary Write Sequence

An exemplary write sequence is outlined below for an embodiment such as that shown in FIGS. 5a and 5b. In order to switch the logical state of a magnetoresistive element, a center magnetization direction of a storage layer of the element must be switched. The center magnetization direction of the storage layer is switched by applying a magnetic field to the element of sufficient strength. Thus, in order to switch the element to a first logical state, a magnetic field of at least $H_1$ strength must be applied to the storage layer. Conversely, in order to switch the element to a second logical state, a magnetic field of at least $H_0$ strength must be applied to the storage layer.

Figure 7:
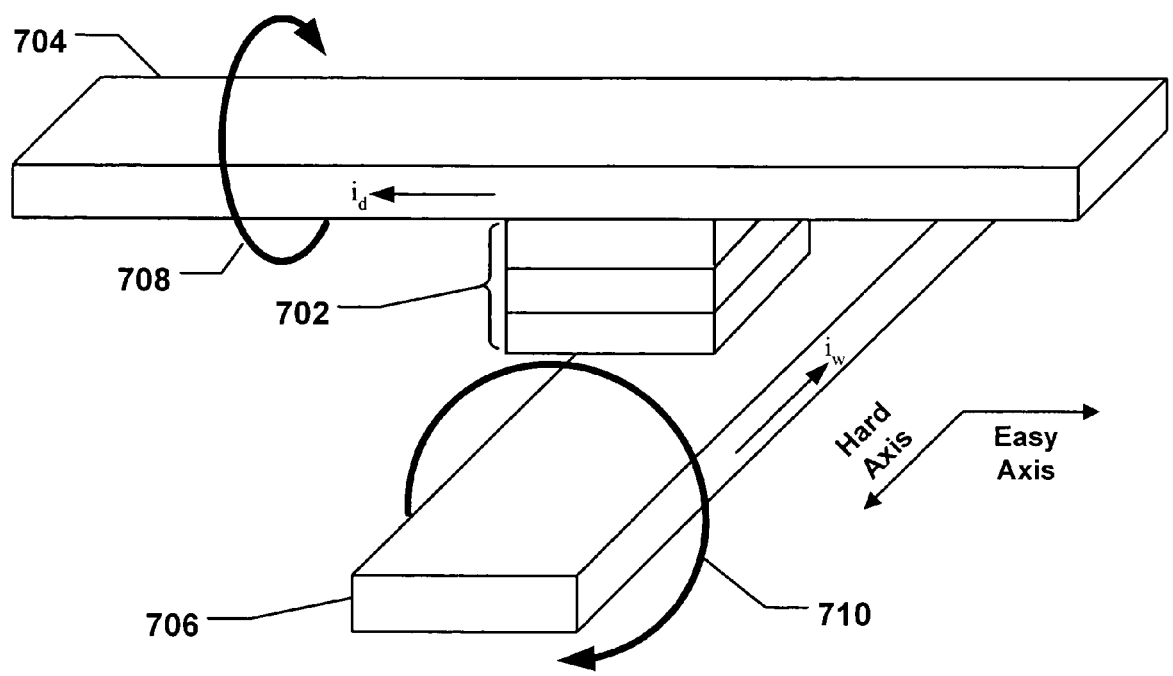
FIG. 7 is an isometric view of an embodiment of a tunneling magnetoresistive cell showing applied magnetic fields.

Referring now to FIG. 7, a digit line 704 is coupled to a tunneling anisotropic magnetoresistive element 702. A word line 706 is arranged near the magnetoresistive element 702, but is electrically isolated from the element 702. A magnetic field used to switch the center magnetization direction the storage layer is created by a digit current ($i_d$) flowing through the digit line 704 acting in combination with a word current ($i_w$) flowing through the word line 706. Each current creates a magnetic field (706 and 708) acting perpendicularly to the current flow. The two magnetic fields (706 and 708) form a combined magnetic field that acts on the storage layer of the element. An embodiment provides that the combined magnetic field is the magnetic field shown by the horizontal axis of FIG. 6.

In one embodiment, the digit line 704 creates a magnetic field along the hard axis of the element that acts to lower the switching threshold of the element, and the word line 708 creates a magnetic field along the easy axis of the element that acts to switch the magnetization direction of the element.

Although the magnetoresistive element 702 is shown positioned orthogonally to the digit line 704 and the word line 606, this positioning is not required. In an embodiment, for example, the magnetoresistive element is rotated by 30 degrees to achiever a better switching performance. Other switching mechanisms may be available for switching the center magnetization direction of the storage layer.

6. Exemplary Read Sequence

A read sequence of an embodiment such as that shown in FIGS. 5a and 5b is described below. In a preferred embodiment, the tunneling anisotropic magnetoresistive element is a current perpendicular to plane (CPP) device. In other words, a read current passed is passed perpendicularly through across the layers of the magnetoresistive element in order to determine a logical state of the magnetoresistive element.

Figure 8:
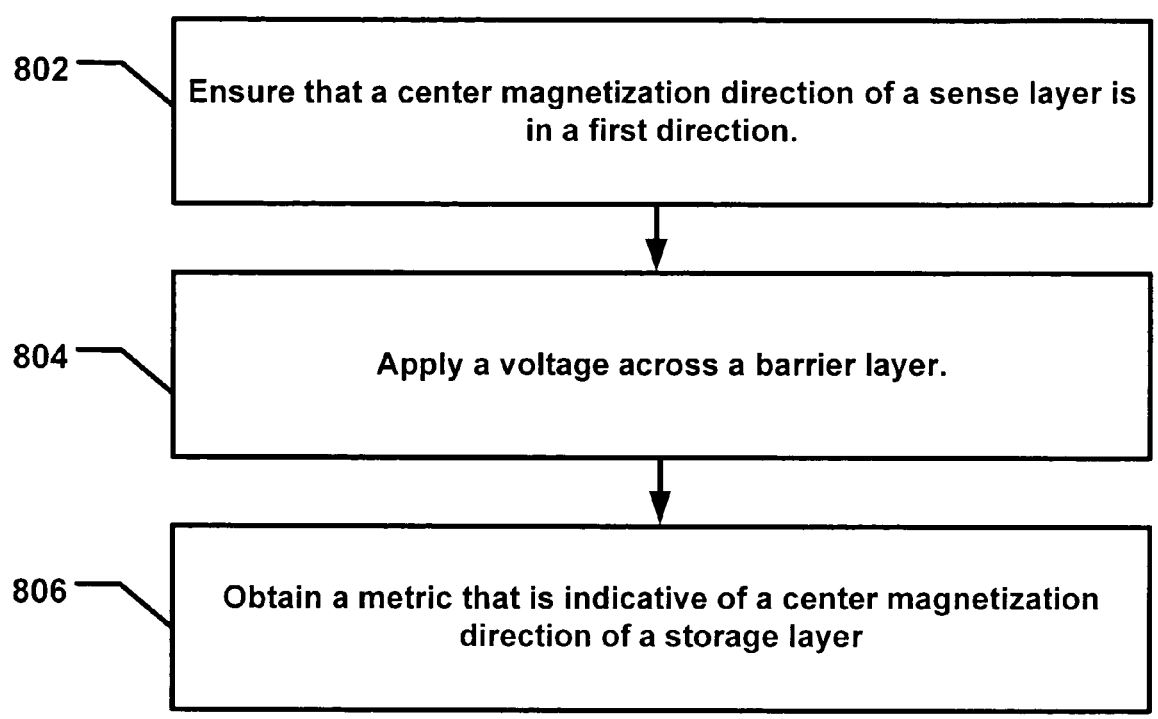
FIG. 8 is a process flow for a read sequence.

FIG. 8 shows a process for determining the logical state of the magnetoresistive element. Step 802 involves ensuring that a center magnetization direction of a sense layer is in a first direction. Ensuring may, for example, be accomplished by applying a magnetic field to the magnetoresistive element.

The magnetic field may be created in a similar fashion to the magnetic fields used in the exemplary write sequence. For example, currents passing through both a digit line and a word line may create a composite magnetic field that acts on the sense layer of the element. In a preferred embodiment, the strength of the first magnetic field should be sufficient to place the magnetization direction of the sense layer in a first magnetization direction without switching the magnetization direction of the storage layer. In an alternative embodiment, the first magnetic field is generated by a current passing through the word line without passing a current through the digit line. Referring to FIG. 6, the first magnetic field should have a greater magnitude than $H_{s1}$ but have a smaller magnitude than $H_1$.

In one embodiment, a first end of the word line is connected to a bit power source through a first word selector, and a second end of the word line is connected to a ground sink through a second word selector. Thus, passing a current through the word line involves selecting the word line with both the first word selector and the second word selector—thus allowing a current to pass from the word power source to the ground sink. Applying a current to the digit line may take a similar form.

Step 804 involves applying a voltage across the barrier layer of the magnetoresistive element. The voltage may be created by closing a switch that interconnects the digit line with a power source and by closing a gate that interconnects the magnetoresistive element to a ground. Thus, a current arc is created flowing from the current source through the magnetoresistive element to the ground. In another embodiment, applying the first voltage comprises applying a current to a digit line that is coupled to a first side of the magnetoresistive element and closing a drain switch that is interconnected between a second side of the tunneling element and a ground sink. In this embodiment, a current passing from the first side of the magnetoresistive element to the second side of the magnetoresistive element pass through the barrier layer of the tunneling element. The drain switch may be controllable by a select line that is attached to the drain switch such that the drain switch is closed when a voltage is applied to the select line.

Step 806 involves obtaining a metric that is indicative of a center magnetization direction of the storage. In one embodiment, the metric is, for example, either a value for the voltage required to pass a predefined current across the element or a value for the current created in the element by a predefined voltage being applied across the element. These values may be measured with, for example, a voltmeter or ammeter.

The logical state of the magnetoresistive element is determined from the center magnetization direction of the storage layer of the magnetoresistive element. In turn, the center magnetization direction of the storage layer may be determined from the resistivity of the magnetoresistive element if the sense layer if the magnetization direction of the sense layer is known. Thus, the metric may be a value for the resistivity of the element.

Preferably, the read sequence is a nondestructive process. This is possible since the magnetization direction of the storage layer is left unchanged.

7. Conclusion

A variety of embodiments have been described above. More generally, those skilled in the art will understand that changes and modifications may be made to these embodiments without departing from the true scope and spirit of the present invention, which is defined by the claims. The drawings have been provided to aid in understanding the invention—the relative scale of various portions of the drawings should not be seen as limiting. Additionally, the various magnetization directions described have been chosen as representative rather than exhaustive. Thus, one skilled in the art will understand that organization of the magnetization directions can be altered without altering performance of the embodiments.

I claim:

1. A method of reading a logical state of a tunneling anisotropic magnetoresistive (TAM) element comprising:
    ensuring that a center magnetization direction of a sense layer of the TAM element is in a first direction;
    applying a voltage across a barrier layer of the TAM element; and
    obtaining a metric indicative of a center magnetization direction of a storage layer of the TAM element.

2. The method of claim 1, wherein ensuring that the center magnetization direction of the sense layer is in the first direction comprises applying a magnetic field to the TAM element, and wherein in response to applying the magnetic field, maintaining the center magnetization direction of the storage layer.

3. The method of claim 2, wherein applying the magnetic field comprises:
    passing a first current through a first line arranged near the TAM element;
    passing a second current through a second line arranged near the TAM element, wherein the magnetic field is a composite magnetic field.

4. The method of claim 3, wherein passing the first current through the first line comprises:
    selecting the first line with a first switch, wherein the first switch interconnects a first end of the first line and a power source; and
    selecting the first line wit a second switch, wherein the second switch interconnects a second end of the bit line and a ground.

5. The method of claim 3, wherein the first line is arranged perpendicularly to the second line.

6. The method of claim 1, wherein applying a voltage across a baffler layer of the TAM element comprises:
    closing a power switch interconnected between a first side of the TAM element and a power source; and
    closing a drain switch interconnected between a second side of the TAM element and a ground, wherein a current passing from the first side of the TAM element to the second side of the tunneling element passes through the baffler layer.

7. The method of claim 5, wherein closing the drain switch comprises applying a voltage to a select line of the drain switch.

8. The method of claim 1, further comprising:
    maintaining an edge spin of the sense layer; and
    maintaining an edge spin of the storage layer.

9. The method of claim 8, wherein the edge spin of the sense layer has a magnetization direction parallel to an easy axis of the TAM element, and wherein the edge spin of the storage layer has a magnetization direction parallel to an easy axis of the TAM element.

10. The method of claim 1, wherein obtaining a metric comprises measuring a current passing through the TAM element.

11. The method of claim 1, wherein obtaining a metric comprises calculating whether a resistivity of the TAM element is above a threshold, the resistivity being above the threshold is indicative of the center magnetization direction of the storage layer being in a second direction.

12. The method of claim 1, wherein the logical state of the tunneling element is nondestructively obtained.

13. The method of claim 1, wherein the center magnetization direction of the sense layer is substantially parallel to a hard axis of the TAM element and wherein the center magnetization direction of the storage layer is substantially parallel to the hard axis.

14. A tunneling anisotropic magnetoresistive (TAM) element comprising:
    a magnetic conducting sense layer having a fixed edge spin and a center magnetization direction;
    a magnetic conducting storage layer having a fixed edge spin and a center magnetization direction; and
    a nonmagnetic nonconducting barrier layer sandwiched between the sense layer and the storage layer.

15. The TAM element of claim 14,
    wherein a magnetization direction of the fixed edge spin of the sense layer is along an easy axis of the TAM element, and
    wherein a magnetization direction of the fixed edge spin of the storage layer is along the easy axis of the TAM element.

16. The TAM element of claim 14,
    wherein the center magnetization direction of the sense layer is along a hard axis of the TAM element, and
    wherein the center magnetization direction of the storage layer is along the hard axis of the TAM element.

17. The TAM element of claim 14, wherein a coercivity of the storage layer is greater than a coercivity of the sense layer.

18. The TAM element of claim 14, further comprising a binary value stored in the TAM element, wherein the center magnetization direction of the storage layer is indicative of the binary value.

19. The TAM element of claim 14,
    wherein the center magnetization direction of the sense layer is configured to invert its direction in response to a first magnetic field of at least a first threshold strength, and
    wherein the center magnetization direction of the storage layer is configured to invert its direction in response to a second magnetic field of at least a second threshold strength, and
    wherein the first threshold strength is less than the second threshold strength.

20. The TAM element of claim 14, wherein the center magnetization direction of the storage layer is configured to switch from a first direction to a, second direction in response to an a first magnetic field of at least a first threshold strength being applied to the TAM element, and
    wherein the center magnetization direction of the storage layer is further configured to switch from a second direction to a first direction in response to a second magnetic field of at least a second threshold strength being applied to the TAM element, wherein the first threshold strength approximately equal to the second threshold strength and wherein the first magnetic field is applied in a direction opposite to that of the second magnetic field.

21. The TAM element of claim 14, wherein the barrier layer has a thickness of approximately 1 nanometer.

22. The TAM element of claim 14, wherein a bit edge of the sense layer has a higher coercivity than a center of the sense layer, and wherein a bit edge of the storage layer has a higher coercivity than a center of the storage layer.

23. The TAM element of claim 22, further comprising a protective oxide layer formed along the bit edge of the sense layer.

24. The TAM element of claim 14, wherein the center magnetization direction of the storage layer is substantially fixed during operation.

25. A tunneling magnetoresistive cell comprising:
a magnetoresistive element comprising a pair of magnetic layers sandwiching a nonmagnetic barrier layer, wherein the magnetic layers each have a pair of bit edges with fixed edge magnetizations aligned parallel to an easy axis of the element, and wherein the magnetic layers each have a magnetically soft center with a center magnetization direction;

a word line for applying a first magnetic field to the magnetoresistive element; and a digit line for applying a second magnetic field to the magnetoresistive element and for delivering a read current to a first side of the magnetoresistive element.

* * * * *

UNITED STATES PATENT AND TRADEMARK OFFICE
CERTIFICATE OF CORRECTION

| | | |
|---|---|---|
| PATENT NO. | : 7,027,321 B2 | Page 1 of 1 |
| APPLICATION NO. | : 10/754882 | |
| DATED | : April 11, 2006 | |
| INVENTOR(S) | : Romney R. Katti | |

It is certified that error appears in the above-identified patent and that said Letters Patent is hereby corrected as shown below:

Column 11, line 41, please delete "baffler", replace with -- barrier --.
Column 11, line 48, please delete "baffler", replace with -- barrier --.
Column 13, line 5, please add -- , -- after "element".
Column 13, line 51, please delete "an".

Signed and Sealed this

Nineteenth Day of June, 2007

JON W. DUDAS
*Director of the United States Patent and Trademark Office*